(12) United States Patent
Kumakura et al.

(10) Patent No.: US 7,459,046 B2
(45) Date of Patent: Dec. 2, 2008

(54) FILM-SHAPED ADHESIVE APPLICATION APPARATUS

(75) Inventors: Hiroyuki Kumakura, Kanuma (JP); Yukio Yamada, Kanuma (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 0 days.

(21) Appl. No.: 11/617,666

(22) Filed: Dec. 28, 2006

(65) Prior Publication Data

US 2007/0102105 A1    May 10, 2007

Related U.S. Application Data

(62) Division of application No. 10/378,686, filed on Mar. 5, 2003, now abandoned.

(30) Foreign Application Priority Data

Mar. 25, 2002    (JP)    ............................. 2002-083288

(51) Int. Cl.
    *B32B 41/00*    (2006.01)
(52) U.S. Cl. ........................................ 156/64; 156/299
(58) Field of Classification Search .................. 156/64, 156/299, 359, 361, 381, 498, 540, 552, 553; 242/909
See application file for complete search history.

(56) References Cited

U.S. PATENT DOCUMENTS

| 4,786,353 | A | 11/1988 | Templeton et al. |
| 4,952,441 | A | 8/1990 | Bose et al. |
| 5,411,825 | A | 5/1995 | Tam |

FOREIGN PATENT DOCUMENTS

| JP | U-49-30899 | 8/1974 |
| JP | A-64-35112 | 2/1989 |
| JP | A-64-35114 | 2/1989 |
| JP | 07-287244 | 10/1995 |
| JP | 10-260422 | 3/1997 |
| JP | 2001-281685 | 10/2001 |

*Primary Examiner*—George R Koch, III
(74) *Attorney, Agent, or Firm*—Oliff & Berridge, PLC

(57) ABSTRACT

A film-shaped adhesive application apparatus includes a supply reel retainer for mounting a film-shaped adhesive supply reel used to wind into a roll shape a film-shaped adhesive 1 comprising a base film and an adhesive layer formed thereon, thermocompression bonding means for thermocompression-bonding the film-shaped adhesive drawn from the film-shaped adhesive supply reel to an adherend, and a winding reel retainer for mounting a winding reel used to wind the base film of the thermocompression-bonded film-shaped adhesive, and further temperature control means (thermal shield plate, cooler, or the like) for controlling the film-shaped adhesive supply reel mounted on the supply reel retainer at a prescribed temperature.

6 Claims, 2 Drawing Sheets

Expanded view

PRIOR ART

PRIOR ART

FILM-SHAPED ADHESIVE APPLICATION APPARATUS

This is a Division of Application of U.S. patent application Ser. No. 10/378,686, filed Mar. 5, 2003, now abandoned. The entire disclosure of the prior application is hereby incorporated by reference herein in its entirety.

BACKGROUND

The present invention relates to a film-shaped adhesive application apparatus for thermocompression-bonding a film-shaped adhesive to a substrate or other such adherend using a film-shaped adhesive supply reel on which the film-shaped adhesive is wound into a roll shape.

Anisotropic conductive films (ACF) are widely used in LCD peripheral mounting, and have recently also been employed in COF (Chip on Film), COB (Chip on Board), and other such bare chip mounting.

As shown in FIGS. 2A and 2B, an anisotropic conductive film 1a typically comprises an anisotropic conductive adhesive layer 3 and a cover film 4 laminated as needed on top of a base film 2, and employing this in bare chip mounting necessitates the use of an anisotropic conductive film supply reel 5a in which the anisotropic conductive film 1a is wound into a roll shape.

As shown in FIG. 4, an application apparatus 10 is employed as an apparatus for temporarily tacking an anisotropic conductive film 1a in a continuous manner to a substrate 30 using the anisotropic conductive film supply reel 5a. This apparatus 10 comprises a supply reel retainer 11 for mounting the anisotropic conductive film supply reel 5a, a stage 12 for mounting the substrate 30 thereon, cover film winding means for separating a cover film 4 from the anisotropic conductive film 1a drawn from the anisotropic conductive film supply reel 5a and winding the cover film on a cover film winding reel 13, film cutting means 14 for fully cutting or half-cutting to a prescribed length the anisotropic conductive film 1a from which the cover film 4 has been separated, a thermocompression bonding roller 15 for thermocompression-bonding the fully cut or half-cut anisotropic conductive film 1a to the substrate 30 and transferring and affixing the anisotropic conductive adhesive layer 3 to the substrate 30, and a winding reel retainer 17 for mounting a winding reel 16 used to wind the base film 2 after the anisotropic conductive adhesive layer 3 is transferred and affixed.

However, as the anisotropic conductive film 1a is drawn from the anisotropic conductive film supply reel 5a in the conventional application apparatus 10, the anisotropic conductive film 1a is sometimes wound tightly inside the anisotropic conductive film supply reel 5a, the anisotropic conductive adhesive layer 3 is squeezed out from the side of the anisotropic conductive film 1a as in FIG. 5, blocking occurs between the anisotropic conductive films 1a during the tacking operation, making it impossible to smoothly draw the anisotropic conductive film 1a and causing the application apparatus 10 to stop. Productivity suffers as a result.

SUMMARY

Therefore, an object of the present invention is to provide an application apparatus that prevents squeeze-out or blocking of an adhesive layer on a film-shaped adhesive supply reel on which an anisotropic conductive film or other such film-shaped adhesive is wound into a roll shape, and enables a film-shaped adhesive to be continuously applied.

The inventors have discovered that controlling the interior of a film-shaped adhesive supply reel at a prescribed temperature by thermally shielding the film-shaped adhesive supply reel from a thermocompression bonding roller or other such heat source or by cooling the film-shaped adhesive supply reel with a spot cooler or the like makes it possible to prevent squeeze-out or blocking of an adhesive layer on the film-shaped adhesive supply reel.

Specifically, the present invention provides a film-shaped adhesive application apparatus comprising a supply reel retainer for mounting a film-shaped adhesive supply reel used to wind into a roll shape a film-shaped adhesive comprising a base film and an adhesive layer formed thereon, thermocompression bonding means for thermocompression-bonding the film-shaped adhesive drawn from the film-shaped adhesive supply reel onto an adherend, and a winding reel retainer for mounting a winding reel used to wind the base film of the thermocompression-bonded film-shaped adhesive; wherein the application apparatus further comprises temperature control means for controlling the film-shaped adhesive supply reel mounted on the supply reel retainer at a prescribed temperature.

EMBODIMENTS

The present invention is described in detail below with reference to diagrams. In each diagram, identical symbols indicate identical or similar structural elements.

Figure 1:
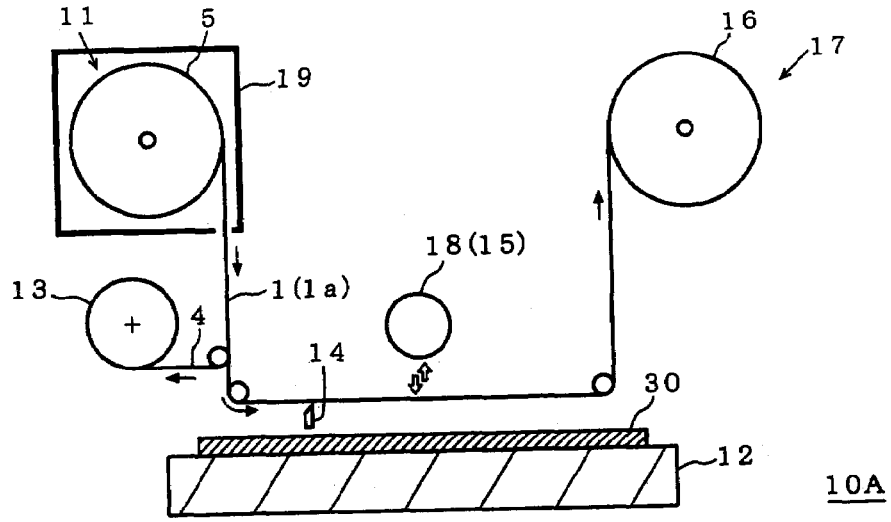
FIG. 1 is a schematic depicting the film-shaped adhesive application apparatus of the present invention.
Figure 2A:
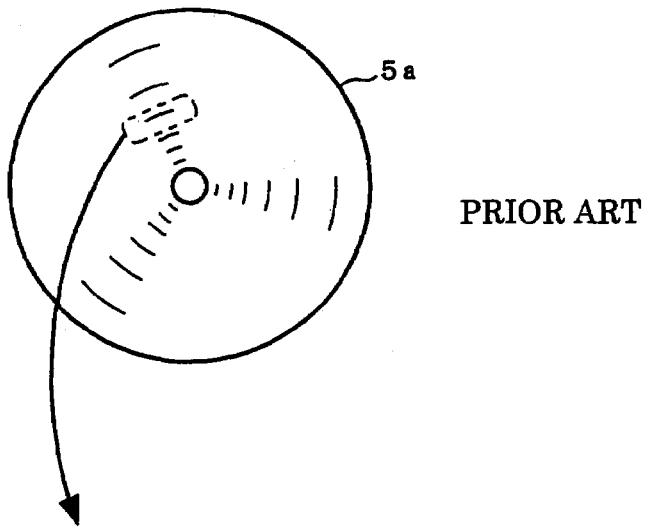
FIGS. 2A and 2B are a side view (a) and an expanded fragmentary view (b) of a reel of an anisotropic conductive film, respectively.
Figure 2B:
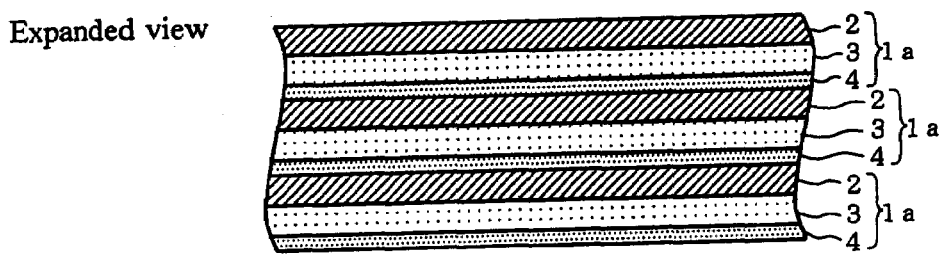

FIG. 1 is a schematic depicting the film-shaped adhesive application apparatus 10A of an embodiment of the present invention. This application apparatus 10A comprises a supply reel retainer 11 for mounting a film-shaped adhesive supply reel 5 in which a film-shaped adhesive 1 is wound into a roll shape, a stage 12 for mounting a substrate 30 or other such adherend thereon, a cover film winding reel 13 for separating a cover film 4 from the film-shaped adhesive 1 drawn from the film-shaped adhesive supply reel 5 and winding the separated cover film 4, film cutting means 14 for fully cutting or half-cutting to a prescribed length the film-shaped adhesive 1 after the cover film 4 has been separated, thermocompression bonding means 18 for thermocompression-bonding the film-shaped adhesive 1 to the adherend, and a winding reel retainer 17 for mounting the winding reel 16 used to wind the base film 2 of the thermocompression-bonded film-shaped adhesive 1.

Examples of the film-shaped adhesive 1 include an anisotropic conductive adhesive film 1a that comprises at least an anisotropic conductive adhesive film layer comprising a base film and an anisotropic conductive adhesive layer laminated on the base film and that may further comprises, if necessary, a cover film laminated on the anisotropic conductive adhesive layer, an insulating adhesive film that comprises a base film and an insulating adhesive layer laminated on the base film, an insulating adhesive film that further comprises a cover film laminated on the insulating adhesive layer as needed, and so on.

The supply reel retainer 11, the stage 12, the film cutting means 14, the thermocompression bonding means 18, and the winding reel retainer 17 may all be identical to widely known application apparatuses. For example, the thermocompression bonding means 18 may be a thermocompression bonding roller 15, thermocompression bonding head, or other component in which the thermocompression bonding surface can be controlled at 70-150° C. and the adherend can be heated and pressed while moved in the direction of the arrow.

A thermal shield plate 19 for thermally shielding the film-shaped adhesive supply reel 5 mounted on the supply reel retainer 11 from the thermocompression bonding means 18 is provided to the application apparatus 10A so as to enclose the film-shaped adhesive supply reel 5 mounted on the supply reel retainer 11. Plastic material is preferably used as the structural material for the thermal shield plate 19 because of the low thermal conductivity thereof. Thus, the thermal shield plate 19 acts as a temperature control means for controlling the film-shaped adhesive supply reel 5 mounted on the supply reel retainer 11 at a prescribed temperature. Specifically, when the film-shaped adhesive 1 is continuously applied by thermocompression bonding to an adherend, the heat from the thermocompression bonding means 18 is prevented from spreading to the film-shaped adhesive supply reel 5, and the film-shaped adhesive 1 is maintained at a temperature at which the adhesive layer constituting the film-shaped adhesive 1 in the film-shaped adhesive supply reel 5 assumes a hardness level sufficient to prevent the adhesive from being squeezed out even when the roll is tightened by the unwinding action of the film-shaped adhesive supply reel 5. More specifically, for example, when the adhesive layer constituting the film-shaped adhesive 1 comprises a epoxy resin or other such thermosetting resin and the 70-150° C. thermocompression bonding operations of the thermocompression bonding means 18 are performed continuously at room temperature, structuring the thermal shield plate 19 from a polycarbonate allows the film-shaped adhesive 1 in the film-shaped adhesive supply reel 5 to be maintained at 30° C. or less.

A spot cooler or other such cooler for cooling the film-shaped adhesive supply reel 5 by blowing cold air on the film-shaped adhesive supply reel 5 mounted on the supply reel retainer 11 may be provided to the application apparatus of the present invention as a temperature control means in place of the previously described thermal shield plate 19 or together with the previously described thermal shield plate 19. When the film-shaped adhesive supply reel 5 is actively cooled by the cooler, overcooling results in condensation on the surface of the film-shaped adhesive 1 and causes the film-shaped adhesives 1 to cling to each other, hindering the application apparatus in its ability to operate in a continuous manner. Therefore, the cooling action of the cooler is appropriately regulated so as not to cause such condensation.

As a temperature control means, the shaft on which the film-shaped adhesive supply reel 5 is mounted in the supply reel retainer 11 may serve as a cooling shaft, allowing the film-shaped adhesive supply reel 5 mounted on the supply reel retainer 11 to be cooled from the side of the winding core of the film-shaped adhesive supply reel 5. A specific structure of the cooling shaft may, for example, be such that the shaft on which the film-shaped adhesive supply reel 5 is mounted is cooled by cooling water, coolant gas, or the like. The temperature can thereby be controlled efficiently.

The application apparatus 10A of the present invention can be embodied in a variety of ways according to the layer structure and the like of the film-shaped adhesive. For example, the cover film winding reel 13 or other such cover film winding means can be dispensed with in the case of film-shaped adhesives with no cover film.

EXAMPLES

Examples 1-5, Comparative Examples 1 and 2

An anisotropic conductive film supply reel (width 5 mm, 50-meter coil) (CP7131, Sony Chemicals Corp.), on which an anisotropic conductive film (cover film thickness 25 μm, adhesive layer thickness 25 μm, base film thickness 50 μm) was wound into a roll shape, was mounted such that the reel tension of the anisotropic conductive film was 100 g, and the anisotropic conductive adhesive layer thereof was continuously thermocompression-bonded to a glass substrate with a thermocompression bonding roll (100° C.) over the entire length of a 50-meter film. In examples 1-5 and Comparative Example 1, the ambient temperature of the reel was controlled as shown in Table 1 by installing a spot cooler within a thermal shield plate composed of a polycarbonate material and regulating the airflow. In Comparative Example 2, neither a thermal shield plate nor a spot cooler was installed.

Evaluation (1) Extent to which adhesive layer was squeezed out: Immediately before completion of the continuous thermocompression bonding, the average value of the extent to which the anisotropic conductive adhesive layer was squeezed out on the side of the anisotropic conductive film was calculated by observing the anisotropic conductive film remaining on the film-shaped adhesive supply reel and measuring the film with a micrometer.

(2) Blocking: Immediately before completion of the continuous thermocompression bonding, the occurrence of blocking of the anisotropic conductive film remaining on the film-shaped adhesive supply reel was ascertained. No blocking was indicated by "G", and blocking was indicated by "NG".

(3) Condensation: During continuous thermocompression bonding, the occurrence of condensation was ascertained by observing (with the naked eye) the surface of the anisotropic conductive film wound on the film-shaped adhesive supply reel. No condensation was indicated by a "G", and condensation was indicated by "NG".

(4) Continuous operability: During continuous thermocompression bonding of the entire 50-meter film, no instances of apparatus shutdown was indicated by "A", less than ten instances of apparatus shutdowns was indicated by "B", and ten or more instances of apparatus shutdown was indicated by "C" a multiplication sign.

Figure 3:
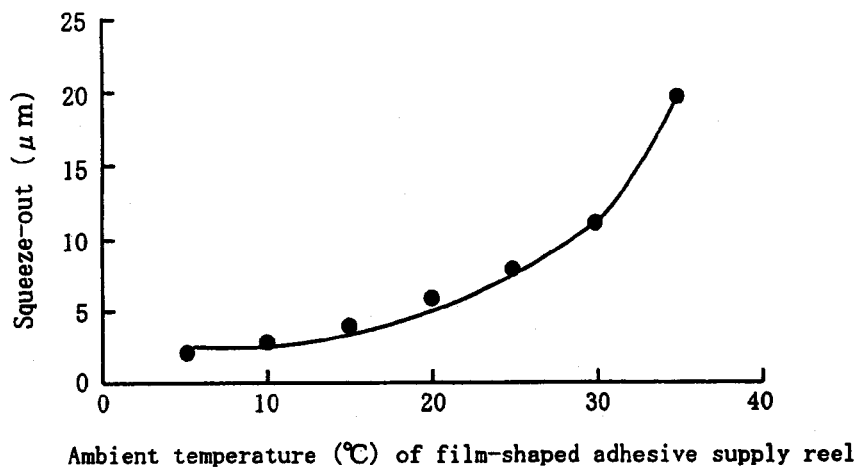
FIG. 3 is a diagram depicting the relation between the ambient temperature of the reel and the extent to which the adhesive layer is squeezed out.
Figure 4:
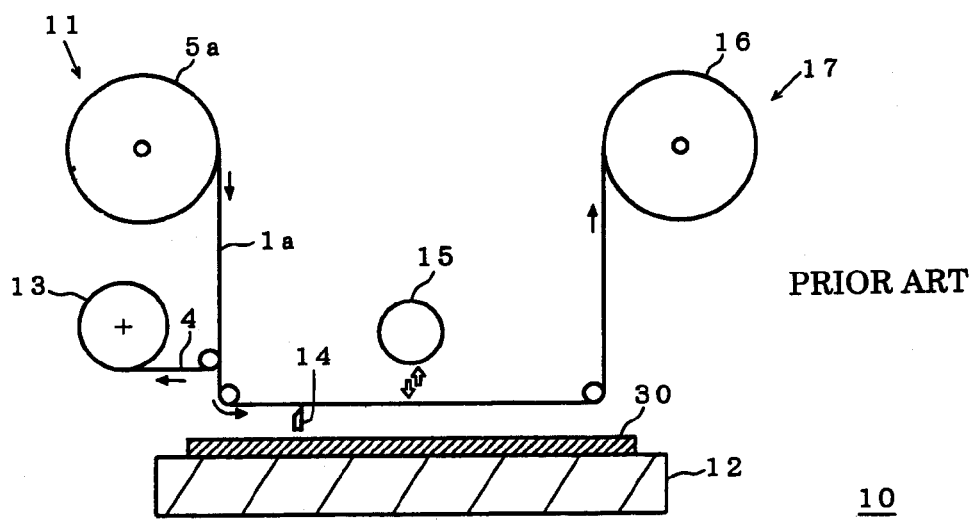
FIG. 4 is a schematic depicting a conventional film-shaped adhesive application apparatus.
Figure 5:
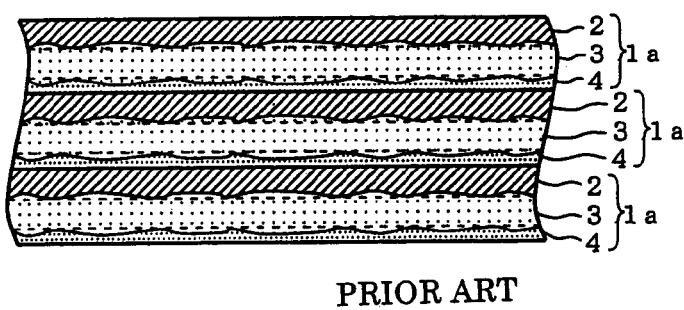
FIG. 5 is a side view of a film-shaped adhesive in which the anisotropic conductive adhesive layer is squeezed out due to roll tightening within the reel.

These results are shown in Table 1. FIG. 3 depicts the relationship between the ambient temperature of the film-shaped adhesive supply reel and the extent to which the adhesive layer was squeezed out.

These results show that controlling the temperature of the film-shaped adhesive supply reel makes it possible to reduce the extent to which the adhesive layer is squeezed out, to prevent blocking, and to continuously operate the application apparatus.

TABLE 1

|  | Temp. (° C.) | Squeeze-out (μm) | Blocking | Condensation | Continuous operability |
|---|---|---|---|---|---|
| Ex. 1 | 30 | 11 | G | G | A |
| Ex. 2 | 25 | 8 | G | G | A |
| Ex. 3 | 20 | 6 | G | G | A |
| Ex. 4 | 15 | 4 | G | G | A |
| Ex. 5 | 10 | 3 | G | G | A |
| Com. Ex. 1 | 5 | 2 | G | NG | B |
| Com. Ex. 2 | 23→35 (*1) | 19 | NG | G | C |

(*1) 23° C. at start of operation, 35° C. at end of operation

By using the film-shaped adhesive application apparatus of the present invention, the film-shaped adhesive can be prevented from being blocked, or the adhesive layer can be prevented from being squeezed out due to roll tightening of the film-shaped adhesive supply reel on which the film-shaped adhesive is wound, and the film-shaped adhesive can therefore be continuously applied.

What is claimed is:

1. A method for applying a film-shaped adhesive comprising:

supplying a film-shaped adhesive from a film-shaped adhesive supply reel;

controlling an amount of adhesive squeezed out of the film-shaped adhesive while the film-shaped adhesive is on the film-shaped adhesive supply reel in a range of from about 3 μm to about 11 μm; the controlling comprising controlling a temperature of the film-shaped adhesive supply reel with a temperature control device to be from 10° C. to 30° C., the controlling of the temperature also preventing formation of condensation on a surface of the film-shaped adhesive;

bonding an adhesive layer of the film-shaped adhesive to an adherend by thermocompression bonding; and removing a base film of the film-shaped adhesive from the adhesive layer, following the bonding, wherein the bonding is achieved by a film-shaped adhesive application apparatus, and the film-shaped adhesive application apparatus comprises:

a supply reel retainer for mounting the film-shaped adhesive supply reel used to wind into a roll shape the film-shaped adhesive composed of a base film and the adhesive layer formed thereon, so that a reel tension of the film-shaped adhesive is 100 g or less, a thermocompression bonding device, the thermocompression bonding device thermocompression-bonding the film-shaped adhesive drawn from the film-shaped adhesive supply reel onto the adherend, a winding reel retainer for mounting a winding reel used to wind the base film of the thermocompression-bonded film-shaped adhesive, and the temperature control device.

2. The method according to claim 1, wherein the temperature control device comprises at least one of:

a thermal shield plate for thermally shielding the film-shaped adhesive supply reel mounted on the supply reel retainer from the thermocompression bonding device;

a cooler for blowing cold air on the film-shaped adhesive supply reel mounted on the supply reel retainer; and a cooling shaft of the supply reel retainer for cooling the film-shaped adhesive supply reel mounted on the supply reel retainer from a winding-core side of the reel.

3. The method according to claim 1, wherein the film-shaped adhesive supply reel is mounted on supply reel retainer mounts, so that the reel tension of the film-shaped adhesive is 100 g or less when the film-shaped adhesive has a width of 5 mm and a thickness of 100 μm.

4. The method according to claim 3, wherein the film-shaped adhesive supply reel is mounted on supply reel retainer mounts, so that the reel tension of the film-shaped adhesive is 100 g when the film-shaped adhesive has a width of 5 mm and a thickness of 100 μm.

5. The method according to claim 1, wherein the film-shaped adhesive further comprises a cover film on the side of the adhesion layer opposite from the base film.

6. The method according to claim 5, wherein the method further comprises removing the cover film to expose the adhesive layer prior to bonding the adhesive layer of the film-shaped adhesive to an adherend.

* * * * *